United States Patent
Naffziger

(10) Patent No.: US 6,377,096 B1
(45) Date of Patent: Apr. 23, 2002

(54) STATIC TO DYNAMIC LOGIC INTERFACE CIRCUIT

(75) Inventor: Samuel D. Naffziger, Ft. Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/696,104

(22) Filed: Oct. 24, 2000

(51) Int. Cl.[7] .......................... H03K 3/12; H03K 3/037; H03K 3/286; H03K 3/356
(52) U.S. Cl. .................. 327/200; 327/211; 327/212
(58) Field of Search .................. 327/158, 199, 327/200, 201, 202, 203, 208, 212, 215, 219

(56) References Cited

U.S. PATENT DOCUMENTS

| | | | | |
|---|---|---|---|---|
| 4,797,575 A | * | 1/1989 | Lofgren .................. | 327/202 |
| 4,879,481 A | * | 11/1989 | Pathak et al. ............. | 326/46 |
| 5,117,124 A | * | 5/1992 | Dicke .................... | 327/212 |
| 5,576,645 A | * | 11/1996 | Farwell .................. | 327/200 |
| 5,640,366 A | * | 6/1997 | Majos et al. ............. | 365/239 |
| 5,684,422 A | * | 11/1997 | Witt et al. ............... | 327/199 |
| 5,734,841 A | * | 3/1998 | Shin et al. ............... | 710/102 |
| 5,774,005 A | * | 6/1998 | Partovi et al. ............ | 327/210 |
| 5,933,369 A | * | 8/1999 | Johnson et al. ........... | 365/233 |
| 5,949,258 A | * | 9/1999 | Jeong .................... | 327/97 |
| 5,968,180 A | * | 10/1999 | Baco ..................... | 713/400 |
| 6,049,887 A | * | 4/2000 | Khandekar et al. ........ | 713/503 |
| 6,172,935 B1 | * | 1/2001 | Wright et al. ............ | 365/233 |
| 6,240,042 B1 | * | 5/2001 | Li ........................ | 365/233 |

* cited by examiner

Primary Examiner—Toan Tran
Assistant Examiner—Long Nguyen
(74) Attorney, Agent, or Firm—Alexander J. Neudeck

(57) ABSTRACT

A static logic signal to dynamic logic interface that produces a monotonic output. An inverse of a dynamic logic evaluate clock is fed to the clock input of a transparent latch with clock and enable inputs. A delayed version of the inverse of the evaluate clock is generated by a delay element. The delayed inverse of the evaluate clock is fed to the enable input of the latch. The input to the latch comes from static logic and the output of the latch is fed to the dynamic logic. The net result is a latch that is open until the evaluate clock is instructing the dynamic logic to evaluate, and remains closed until a delay element delay time after the evaluate clock instructs the dynamic logic to reset.

3 Claims, 1 Drawing Sheet

US 6,377,096 B1

STATIC TO DYNAMIC LOGIC INTERFACE CIRCUIT

FIELD OF THE INVENTION

The present invention relates generally to CMOS integrated circuits, and more particularly, to CMOS circuit techniques for interfacing from static single-ended logic to differential dynamic logic.

BACKGROUND OF THE INVENTION

Static logic gates have been utilized to construct logic circuits for performing mathematical operations. Static logic gates are those which can continuously perform logic operations so long as electrical power is available. In other words, static logic gates need no electrical precharge, or refresh, in order to properly perform logic operations. However, static logic gates are undesirably slow individually and, when chained together to collectively perform a logic function, are even slower.

Dynamic logic gates are used in the design of logic circuits which require high performance and modest size. Dynamic logic gates are those which require a periodic electrical precharge, or refresh, such as with a dynamic random access memory (RAM), in order to maintain and properly perform its intended logic function. Once an electrical precharge supplied to a dynamic logic gate has been discharged by the dynamic logic gate, the dynamic logic gate can no longer perform another logic function until subsequently precharged. Accordingly, dynamic logic usually has at least two clock phases. One clock phase is called the precharge phase. During the precharge phase, the electrical precharge is supplied to the dynamic logic gates. A second clock phase is called the evaluate phase. During the evaluate phase, the electrical precharges of the dynamic logic gates may be discharged depending upon the inputs to the dynamic logic gates.

It is often desireable to mix static and dynamic logic circuits on the same integrated circuit. This allows the designer to pick the appropriate type of logic depending upon a variety of factors including speed, power dissipation, simplicity, cost, and ease of use.

Unfortunately, a typical requirement of dynamic logic is that the inputs to a dynamic gate either remain stable during the entire evaluate phase, or that the inputs are monotonic. That means that only one transition from a predetermined logic level to the other one may occur without causing problems. Typically, the allowed transition is a single low to high transition. However, static logic may transition in either direction, multiple times, during a clock cycle. Therefore, signals driven by static logic should not be used as inputs to dynamic logic. This presents a problem for integrated circuits that want to mix static and dynamic logic circuits.

Accordingly, there is a need in the art for a circuit that interfaces static logic to dynamic logic. It is desirable that such a circuit use clocks that are standard to both the static and dynamic circuits. This simplifies design. Likewise, to simplify design, such a circuit should use standard circuit elements.

SUMMARY OF THE INVENTION

In a preferred embodiment, the invention provides a static logic signal to dynamic logic interface that produces a monotonic output. The invention is fast because it does not introduce a "dead" gate delay where no useful logic function is performed into the evaluation phase of the dynamic logic. The invention does not require the generation of special clocks that can create setup and hold time problems. Finally, the invention may be constructed using standard CMOS integrated circuit building blocks which simplifies design and implementation.

An embodiment of the invention uses standard clock signals, a delay element that can be as simple as a series of inverters, and an enabled latch to interface static logic to dynamic logic. The inverse of the dynamic logic evaluate clock is fed to the clock input of a transparent latch with clock and enable inputs. A delayed version of this clock is generated by the delay element. This delayed inverse of the dynamic logic evaluate clock is fed to the enable input of the latch. The input to the latch comes from static logic and the output of the latch is fed to the dynamic logic. The net result is a latch that is open until the evaluate clock is instructing the dynamic logic to evaluate and remains closed until a delay element delay time after the evaluate clock instructs the dynamic logic to reset.

DETAILED DESCRIPTION OF THE PREFERRED EMBODIMENTS

Figure 1:
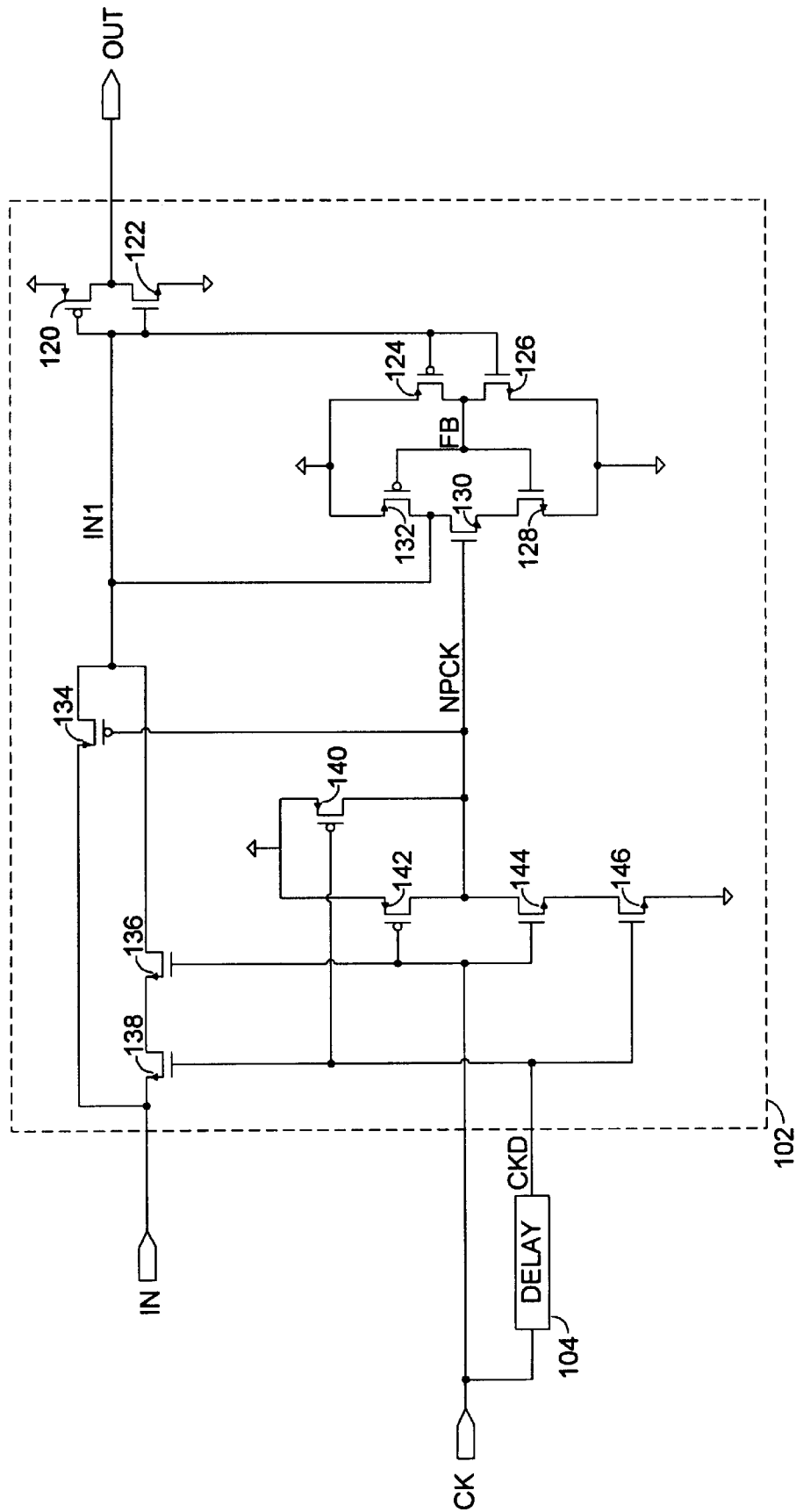
FIG. 1 is a schematic illustration of a static logic to dynamic logic interface that produces a monotonic output.

FIG. 1 is a schematic illustration of a static to dynamic logic interface that produces a monotonic output. In FIG. 1, IN is the input signal from static logic. OUT is the output signal that may be connected to dynamic logic. CK is the inverse of the dynamic logic evaluate clock. In the embodiment shown in FIG. 1, when CK is low it is the dynamic logic evaluate phase. CK is input to delay element 104. The output of delay element is a delayed version of CK called CKD. Delay element 104 may be as simple as an even number of inverters. CK is also connected to the clock input of a transparent latch 102 and CKD is connected to an enable input of transparent latch 102.

The net result of feeding CK and CKD the clock input and the enable input, respectively, of transparent latch 102 is a static to dynamic logic interface that is open until the inverse of the dynamic logic evaluate clock falls. This static to dynamic logic interface also remains closed until a delay element delay after the dynamic logic evaluate clock falls. These properties help prevent hold time problems while providing timing benefits in an easy to construct solution with low implementation cost.

In FIG. 1, static logic signal IN is connected to the source of n-channel MOSFET (NFET) 138 and the source of p-channel MOSFET (PFET) 134. The drain of NFET 138 is connected to the source of NFET 136. The drain of NFET 136 is connected to node IN1. IN1 is a latching node for transparent latch 102 in that feedback provided by other transistors 124, 126, 132, 130, and 128 cause the value on IN1 to be retained even when pass gates 138, 136, and 134 are all off.

The drain of PFET 134 is also connected to IN1. IN1 is connected to the input of an inverter comprised of NFET 122 and PFET 120. The output of this inverter is OUT. This arrangement allows static logic signal IN to propagate through pass gate transistors 138, 136, and 134 to IN1 and then to OUT with only one inverter gate delay plus some delay from the pass gate transistors. Accordingly, when pass gate transistors 138, 136 and 134 are on, changes in the signal IN are passed quickly to the output, OUT.

Also in FIG. 1, the enable input of transparent latch 102 which is connected to CKD, is connected to the gate of NFET 138, the gate of NFET 146, and the gate of PFET 140. The clock input of transparent latch 102 which is connected to CK, is connected to the gate of NFET 136, the gate of NFET 144, and the gate of PFET 142. The source of NFET 146 is connected to the negative supply voltage. The drain of NFET 146 is connected to the source of NFET 144. The drain of NFET 144 is connected to node NPCK. Node NPCK is connected to the drain of PFETs 140 and 142. NPCK is also connected to the gate of PFET 134 and the gate of NFET 130.

As mentioned above, NFET 122 and PFET 120 are connected to form an inverter. Accordingly, node IN1 is connected to the gate of NFET 122 and the gate of PFET 120. The drain of NFET 122 and the drain of PFET 120 are connected to node OUT. The source of NFET 122 is connected to the negative supply voltage. The source of PFET 120 is connected to the positive supply voltage.

Node IN1 is also connected to an inverter constructed with NFET 126 and PFET 124. Accordingly, node IN1 is connected to the gate of NFET 126 and the gate of PFET 124. The drain of NFET 126 and the drain of PFET 124 are connected to node FB. The source of NFET 126 is connected to the negative supply voltage. The source of PFET 124 is connected to the positive supply voltage.

Node FB is connected to the gate of PFET 132 and the gate of NFET 128. The source of NFET 128 is connected to the negative supply voltage. The drain of NFET 128 is connected to the source of NFET 130. The drain of NFET 130 is connected to node IN1. The drain of PFET 132 is also connected to node IN1.

From the foregoing it will be appreciated that the static to dynamic logic interface provided by the invention offers numerous advantages. It may be constructed from elements common to many integrated circuit designs. It uses a standard clock signal as an input clock. Finally, the various delays from its inputs to its output help prevent hold time problems while providing timing benefits.

Although a specific embodiment of the invention has been described and illustrated, the invention is not to be limited to the specific forms or arrangements of parts so described and illustrated. The invention is limited only by the claims.

What is claimed is:

1. A static logic to dynamic logic interface, comprising:

a clock that is the inverse of a second clock that causes dynamic logic to evaluate;

a delay element that generates a delayed clock; and, a latch having a data input that interfaces to static logic, an output that interfaces to dynamic logic, a first pass gate having a first pass gate output, said first pass gate receiving said data input and being controlled by said delayed clock, a second pass gate having a second pass gate output that controls a latching node of said latch, said second pass gate receiving said first pass gate output and being controlled by said clock, and a third pass gate receiving said data input and outputting to said latching nodes.

2. The interface of claim 1 wherein said latch inverts said latching node of said latch to produce said output.

3. The interface of claim 2 wherein said delay element comprises a plurality of inverters.

* * * * *